(12) United States Patent
Lam et al.

(10) Patent No.: US 7,051,303 B1
(45) Date of Patent: May 23, 2006

(54) METHOD AND APPARATUS FOR DETECTION AND ISOLATION DURING LARGE SCALE CIRCUIT VERIFICATION

(75) Inventors: William K. Lam, Newark, CA (US); Mohamed Soufi, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 4 days.

(21) Appl. No.: 10/747,577

(22) Filed: Dec. 29, 2003

(51) Int. Cl.
*G06F 17/50* (2006.01)

(52) U.S. Cl. ............................................. 716/4; 716/5
(58) Field of Classification Search ................ 716/1–6, 716/16–18
See application file for complete search history.

(56) References Cited

U.S. PATENT DOCUMENTS

| | | | |
|---|---|---|---|
| 6,493,852 B1 * | 12/2002 | Narain et al. .................... | 716/5 |
| 6,539,523 B1 * | 3/2003 | Narain et al. .................... | 716/5 |
| 6,591,403 B1 * | 7/2003 | Bass et al. ....................... | 716/5 |
| 6,678,875 B1 * | 1/2004 | Pajak et al. ..................... | 716/11 |
| 6,785,873 B1 * | 8/2004 | Tseng ............................. | 716/4 |
| 2004/0015739 A1 * | 1/2004 | Heinkel et al. ................ | 714/37 |

* cited by examiner

*Primary Examiner*—Stacy A. Whitmore
*Assistant Examiner*—Binh Tat
(74) *Attorney, Agent, or Firm*—Osha Liang LLP

(57) ABSTRACT

A method for providing verification for a simulation design involves analyzing a simulation design using a testbench comprising a rapid bug detection tool, and if a bug is detected, adding a bug isolation tool to the testbench, and isolating and eliminating the bug using the testbench comprising the bug isolation tool.

19 Claims, 4 Drawing Sheets

METHOD AND APPARATUS FOR DETECTION AND ISOLATION DURING LARGE SCALE CIRCUIT VERIFICATION

BACKGROUND OF INVENTION

Modem high performance microprocessors have an ever-increasing number of circuit elements and an ever-rising clock frequency. Also, as the number of circuits that can be used in a CPU has increased, the number of parallel operations performed by the circuits has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a circuit design perspective, important considerations such as the time needed to complete a circuit simulation and the time needed to debug the CPU are taken into account.

As each new CPU design uses more circuits and circuit elements, each often operating at increased frequencies, the time required to simulate the circuit design increases. Due to the increased time for simulation, the number of tests, and consequently the test coverage, may decrease. In general, the result has been a dramatic increase in the logic errors that escape detection before the CPU is manufactured.

Circuit simulation may occur at a "switch-level." Switch-level simulations typically include active circuit elements (e.g., transistors) and passive circuit elements (e.g., resistors, capacitors, and inductors). Circuit simulation also may occur at a "behavioral level." Behavioral level simulations typically use a hardware description language (HDL) that determines the functionality of a single circuit element or group of circuit elements.

A typical behavioral level simulation language is "Verilog," which is an Institute of Electrical and Electronics Engineers standard. Verilog HDL uses a high-level programming language to describe the relationship between the input and output of one or more circuit elements. Verilog HDL describes on what conditions the outputs should be modified and what affect the inputs have.

Verilog HDL programs may also be used for logic simulation at the "register transfer level" (RTL). RTL is a programming language used to describe a circuit design. The RTL programs written in Verilog go through a verification process. During this process, the Verilog design is parsed and checked for RTL style conformance by a style checker.

Using the Verilog HDL, for example, digital systems are described as a set of modules. Each module has a port interface, which defines the inputs and outputs for the module. The interface describes how the given module connects to other modules. Modules can represent elements of hardware ranging from simple gates to complete systems. Each module can be described as an interconnection of sub-modules, as a list of terminal elements, or a mixture of both. Terminal elements within a module can be described behaviorally, using traditional procedural programming language constructs such as "if" statements and assignments, and/or structurally as Verilog primitives. Verilog primitives include, for example, truth tables, Boolean gates, logic equation, pass transistors (switches), etc.

HDL simulations, written using HDL languages, may be event-driven or cycle-based. Event-driven simulators are designed to eliminate unnecessary gate simulations without introducing an unacceptable amount of additional testing. Event-driven simulators propagate a change in state from one set of circuit elements to another. Event-driven simulators may record relative timing information of the change in state so that timing and functional correctness may be verified. Event-driven simulators use event queues to order and schedule the events. Event-driven simulators process and settle all the active events in a time step before the simulator can move to the next time step.

Cycle-based simulators also simulate a change in state from one set of circuit elements to another; however, the state of an entire system is evaluated once each clock cycle. Cycle-based simulators are applicable to synchronous digital systems and may be used to verify the functional correctness of a digital design. Cycle-based simulators abstract away the timing details for all transactions that do not occur on a cycle boundary. Cycle-based simulators use algorithms that eliminate unnecessary calculations to achieve improved performance in verifying system functionality. Discrete component evaluations and re-evaluations are typically unnecessary upon the occurrence of every event.

Cycle-based simulators typically have enhanced performance. Depending on the particular options used, cycle-based simulators can offer five to ten times improvement in speed and one-fifth to one-third the memory utilization over conventional, event-driven simulators. Some cycle-based simulators also offer very fast compile times. For very large designs, the reduced memory requirements of cycle-based simulators allow a design team to simulate a design on almost every workstation on their network.

A typical simulation system (e.g., cycle-based simulator) is shown in FIG. 1. A simulation design source code (100), which includes, for example, Verilog files, clock files, etc., is an input into a simulation design compiler (102). The simulation design compiler (102) statically generates simulation design object code (104). A linker/loader (106) takes as input the simulation design object code (104) and a test vector object code (108), which is output from a stimulus compiler (110). Test vector source code (112) is input into the stimulus compiler (110).

The test vector object code (108) provides stimulus in the form of input signal values for the simulation, which is run on the simulator (114). For example, if a particular module included in the simulation design object code (104) includes an AND gate, the test vector object code (108) may provide stimulus in the form of a signal value equal to "1" to be sent to a pin of the AND gate at a particular time. The test vector object code (108) may also include expected outputs for signal values stimuli.

The test vector object code (108) may include multiple test vectors. For example, a collective test vector may include a first test vector to test a first group of modules of the simulation design object code (104), and a second test vector to test a second group of modules of the simulation design object code (104).

Using the test vector (108) and the simulation design object code (104), the linker/loader (106) generates and loads an executable code (i.e., an executable program or simulation image) into the memory of simulator (114), where the simulation is performed. Depending on implementation, the simulator may use typical, "standard" computer architectures, such as may be found in a workstation, or may use other, "non-standard" computer architectures, such as computer architectures developed specifically for simulation or specifically for verification of circuit design, e.g., a massively parallel processing machine.

SUMMARY OF INVENTION

In general, in one aspect, the invention relates to a method for providing verification for a simulation design. The method comprises analyzing a simulation design using a testbench comprising a rapid bug detection tool, if a bug is detected, adding a bug isolation tool to the testbench, and isolating and eliminating the bug using the testbench comprising the bug isolation tool.

In general, in one aspect, the invention relates to a computer system for providing verification for a simulation design. The method comprises a processor, a memory, a storage device, and software instructions stored in the memory for enabling the computer system to analyze a simulation design using a testbench comprising a rapid bug detection tool, if a bug is detected, add a bug isolation tool to the testbench, and isolate and eliminate the bug using the testbench comprising the bug isolation tool.

In general, in one aspect, the invention relates to a system for verifying a simulation design. The system comprises a test vector providing an input signal value for the component in the simulation design, a testbench for verifying the simulation design using the test vector, a rapid bug detection tool associated with the testbench for analyzing the simulation design for a bug, and a bug isolation tool associated with the testbench for isolating and eliminating the bug, wherein the bug isolation tool is added to the testbench if the bug is detected by the rapid bug detection tool.

In general, in one aspect, the invention relates to an apparatus providing verification for a simulation design. The apparatus comprises means for analyzing a simulation design for a bug using a testbench comprising a rapid bug detection tool, means for adding a bug isolation tool to the testbench, if the bug is detected, means for isolating and eliminating the bug using the testbench comprising the bug isolation tool.

Other aspects and advantages of the invention will be apparent from the following description and the appended claims.

DETAILED DESCRIPTION

Figure 1:
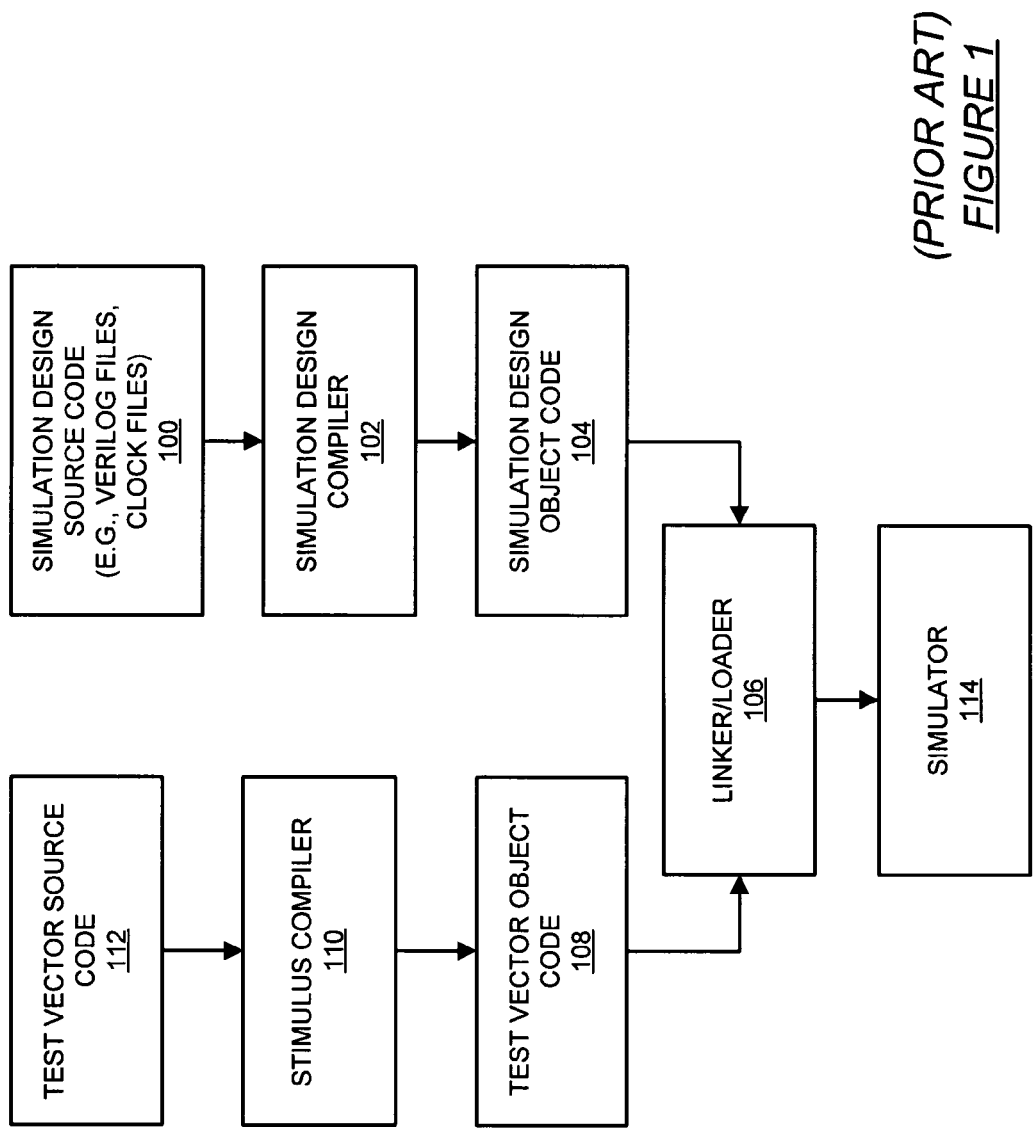
FIG. 1 illustrates a flow diagram of a typical simulation system.

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Manufacturers of highly complex circuit designs, such as Central Processing Units (CPU's), typically require verification of simulation design objects in order to verify that the circuits are designed properly. Typically, verification is used to compare a first version of the design to a second version of the design. Often the first version of the design corresponds to a high-level description of the design, such as an Instruction Set Simulator (ISS) model, and the second version corresponds to a lower level design, such as design implemented at the register level (e.g., an RTL design). Typically, one of the versions already has been verified, and serves as a specification, or reference, against which the other version is verified. In the above scenario, the high level design typically serves as the reference version.

In the traditional design verification scheme, a large testbench with complex monitors is coupled with the simulation design. The purpose of the testbench is to apply stimuli and find bugs in a simulation design. For difficult bugs, it is not uncommon to have complex testbenches and monitors so that the root causes of the bugs can be gathered and displayed. These complex testbenches use a substantial amount of system resources and affect the entire system's simulation performance. Often, the majority of simulation time is spent on testbenches. Accordingly, a system's complex monitors for large-scale simulation design are costly. Additionally, the styles used by most testbenches are often deemed to be unacceptable by a hardware simulator, e.g., cycle-based hardware simulators.

The present invention relates to a two stage approach for debugging a design simulation during verification. Instead of resolving all bugs in one-shot approach, the present invention initially detects bugs with a testbench using a rapid bug detection tool that provides an overall fast simulation speed. As one skilled in the art would expect, the rapid bug detection tool is very simple and does not provide sufficient functionality or enough information to adequately isolate the bugs of a design. Thus, the goal in this first stage is focused on bug detection rather than isolation.

Once a bug is detected, one or more additional tools are added to the testbench allowing for isolation and correction of any bugs discovered in the first stage. As one skilled in the art would expect, simulation speed is slow during the second stage. The diminished speed during the second stage is seen as acceptable because the additional apparatus is only added (with its resulting reduction in speed) when a bug is actually discovered.

While the present invention is described as involving two stages, one skilled in the art can appreciate that the procedure may be considered to include more or less than two stages.

Figure 2:
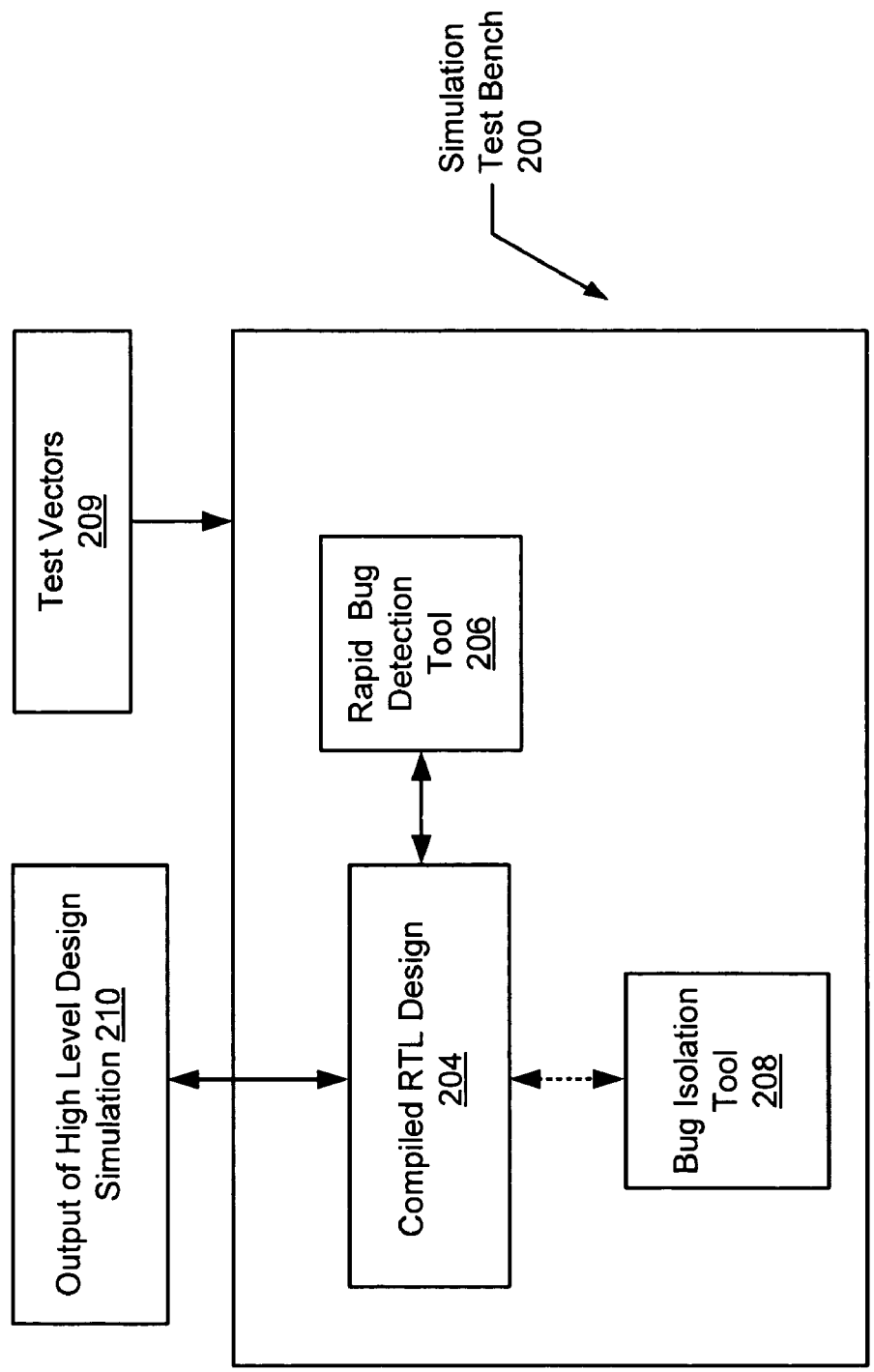
FIG. 2 illustrates a flow diagram of a typical interaction between an RTL design and a corresponding simulation design in accordance with one embodiment of the invention.

FIG. 2 illustrates a flow diagram of a typical interaction between an RTL design and a corresponding simulation design in accordance with an embodiment of the invention.

Initially, a simulation design and a corresponding RTL design are created. Once an RTL design has been coded, the RTL design is compiled to generate a compiled RTL design (204). At this stage, the compiled RTL design (204) is linked (i.e., the binary files corresponding to the compiled RTL design (204) are linked).

The compiled RTL design (204) is then loaded into a Simulation Test Bench (STB) (200) along with one or more test vectors (209). The compiled RTL design (204) is then executed, with the test vectors serving as input to the compiled RTL design (204). If the value of the corresponding RTL design component matches a reference value, then the STB (200) resumes execution of the compiled RTL design (204). Otherwise, the STB (200) typically outputs an error message, and then resumes execution of the compiled RTL design (204).

The reference value is denoted as Output of High Level Design Simulation (210) in FIG. 2. Depending on implementation of the RTL design verification, the Output of High Level Design Simulation (210) may be generated prior to execution of the compiled RTL design (204) or generated concurrently on a cycle-by-cycle basis, as is typically seen in prior art ad hoc design verification methods.

Typically, if STB (200) is a hardware-based simulation system, the STB (200) is able to execute the compiled RTL design (204) in a very efficient manner.

However, complex monitors associated with the STB (200) tend to decrease the efficiency with which the compiled RTL design (204) is executed. Reducing the complexity of the monitors typically has the effect of increasing efficiency of the simulation. In one embodiment of the invention, the STB (200) is associated with monitors with a variety of sizes, functionality, and complexity. Examples of the monitors include a rapid bug detection tool (206) and/or a bug isolation tool (208).

The rapid bug detection tool (206) may include assertion suites (e.g., Open Verilog Language ("OVL"), System Verilog assertion suites) that allow one-cycle bug detection, i.e., all bugs that occur within the current cycle detected during that cycle. The bug isolation tool (208) may include complex memory array monitors that examine stored/accessed entries and/or a utility to dump signal traces in Value Change Dump ("VCD"), Waveform Intermediate Format ("WIF"), Integrated Signal Database ("ISDB"), and/or Fast Signal Database ("FSDB") file format.

Figure 3:
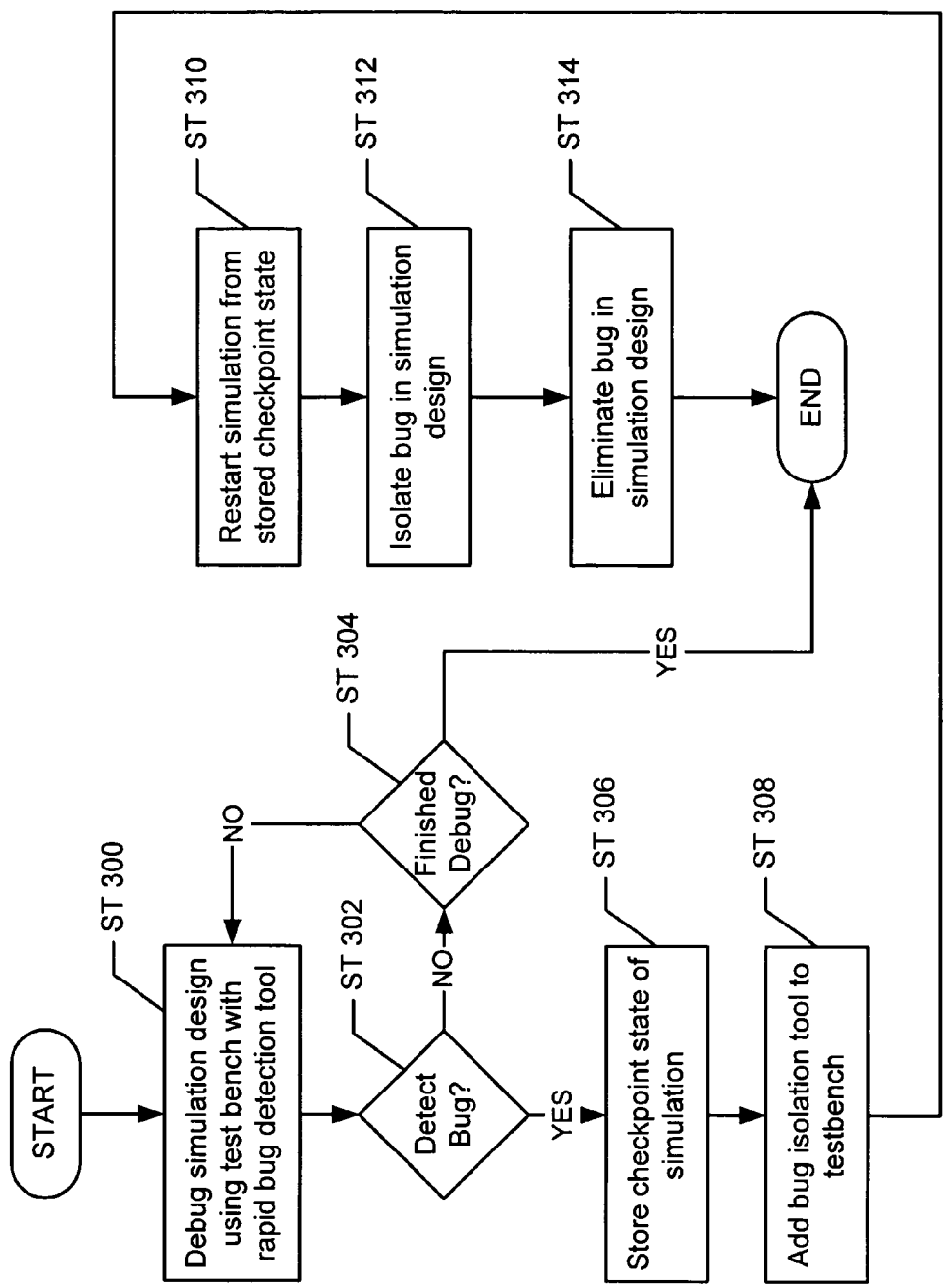
FIG. 3 illustrates a flow chart of a process for debugging in accordance with an embodiment of the invention

FIG. 3 shows a flowchart of the two-stage process for debugging in accordance with an embodiment of the invention. In stage one, the simulation design is debug using the rapid bug detection tool that is associated with the testbench (Step 300). The requirements for testbench apparatus include: 1) performance impact that is less than fifteen percent; and 2) the measured checkpointing interval is N cycles and all bugs must be observable in N cycles or fewer.

To be considered a lightweight bug detection tool, certain performance impact requirements should be met, including: 1) node values are concatenated into 64-bit vectors; 2) all previously concatenated vectors are added together to arrive a "syndrome" value, etc. This syndrome value is then compared with a reference value. If the syndrome value is different from the reference value, a determination can be made that a bug occurred.

If a bug is detected (Step 302), the debugging process proceeds to stage two. Otherwise, a determination is made whether the debugging is complete (Step 304). If so, the execution of the simulation ends. If debugging is to continue, then control returns to Step 300.

Stage two involves storing a checkpoint state of a simulation (Step 306) and then adding a bug isolation tool, i.e., a more sophisticated apparatus, to the testbench (Step 308). In an embodiment of the invention, storing the checkpoint state of a simulation occurs only after a bug is discovered and involves storing the value of each elements in a circuit design at a particular point in the simulation, e.g., at every 25,000 clock ticks. The particular point to checkpoint the simulation is typically determined by a user prior to the execution of the simulation, however, one skilled in the art will appreciate that the point could be modified during the execution of the simulation.

Next, the simulation restarts from the stored checkpoint state (Step 310). Once the simulation begins execution, the bug is isolated (Step 312) and information regarding the bug in gathered and displayed. Eventually, the bug in the simulation design is eliminated (Step 314).

Figure 4:
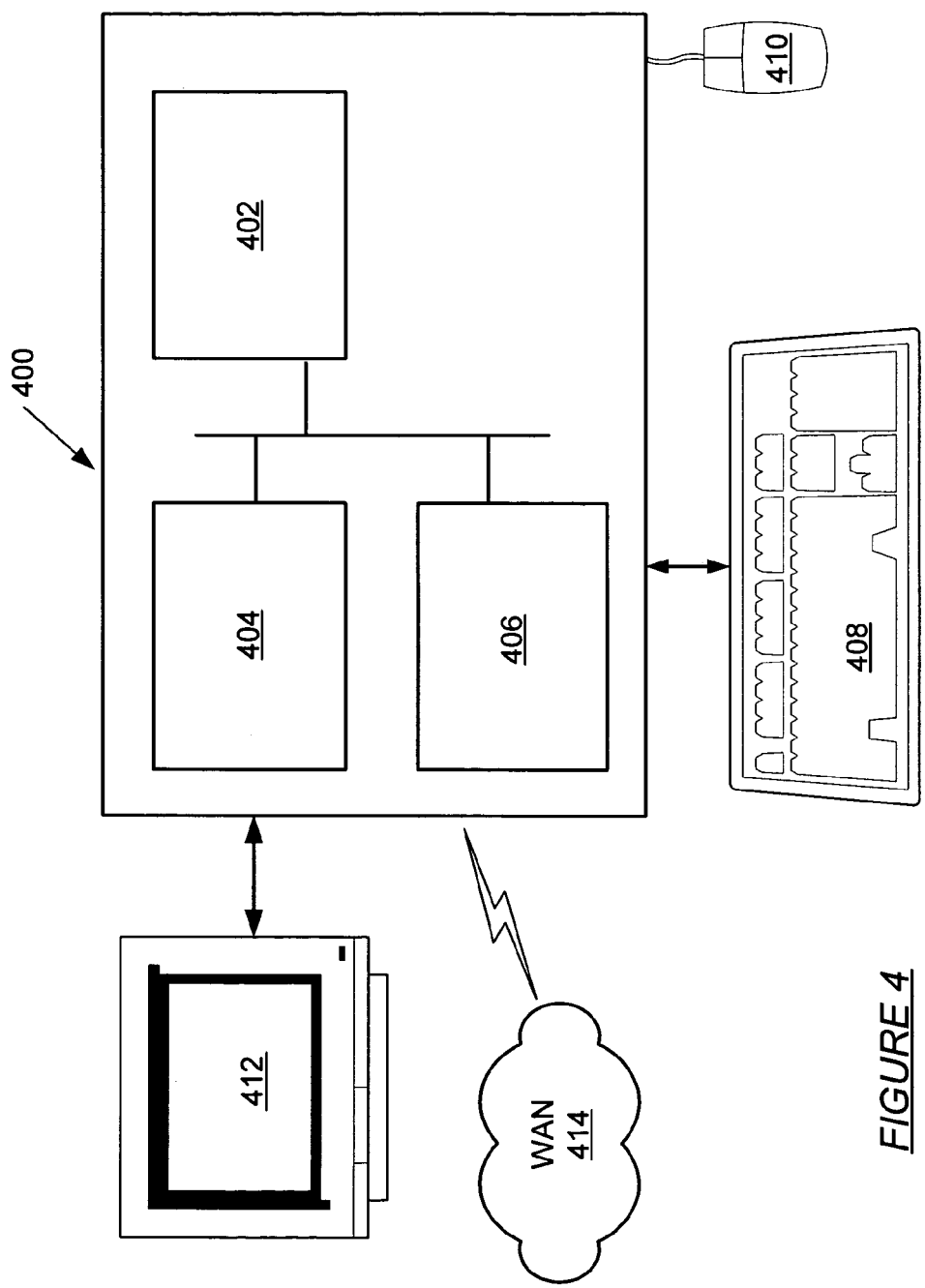
FIG. 4 illustrates a typical networked computer system.

The invention may be implemented on virtually any type computer regardless of the platform being used. For example, as shown in FIG. 4, a typical networked computer system (400) includes a processor (402), associated memory (404), a storage device (406), and numerous other elements and functionalities typical of today's computers (not shown). The networked computer (400) may also include input means, such as a keyboard (408) and a mouse (410), and output means, such as a monitor (412). The networked computer system (400) is connected to a wide area network (414) (e.g., the Internet) via a network interface connection (not shown). Those skilled in the art will appreciate that these input and output means may take other forms. Those skilled in the art will appreciate that these input and output means may take other forms. Further, those skilled in the art will appreciate that one or more elements of the aforementioned computer (400) may be located at a remote location and connected to the other elements over a network.

Embodiments of the present invention may have one or more of the following advantages. In general, in one aspect the invention is meant for the same simulator where the full-fledged model can fit on the hardware simulator. Further, bugs that are not observable in the ending state subset of the simulation are detected by the hardware model detection using the present invention. In one or more embodiments of the invention, the two stages are meant to be run on either the same simulator or different simulators and the coverage spaces provided using any simulator is identical. The difference is that one emphasizes speed, and especially rapid simulation performance, where bug isolation is unnecessary. Further, engineers avoid facing a dilemma by improving simulation performance and avoiding high maintenance efforts, while still eliminating bugs.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for providing verification for a simulation design, comprising:
    analyzing a simulation design during a first stage of verification using a testbench comprising a rapid bug detection tool;
    if a bug is detected in the first stage, executing a second stage of verification, wherein
    a bug isolation tool is added to the testbench; and
    the bug is isolated and eliminated using the testbench comprising the bug isolation tool,
    wherein the bug isolation tool comprises a complex memory array monitor to examine stored entries, and
    wherein the rapid bug detection tool comprises an assertion suite that allows bug detection in a single cycle.

2. The method of claim 1, wherein the simulation design comprises a register transfer level design.

3. The method of claim 1, further comprising:
    storing a checkpoint state of a simulation; and
    restarting the simulation from the checkpoint state, if the bug is detected.

4. The method of claim 1, wherein the rapid bug detection tool is lightweight.

5. The method of claim 1, wherein the rapid bug detection tool comprises at least one assertion suite selected from a group consisting of Open Verilog Language and System Verilog.

6. The method of claim 1, wherein the bug isolation tool comprises a tool to dump a signal trace in at least one file format selected from a group consisting of Value Change Dump, Waveform Intermediate Format, Integrated Signal Database, and Fast Signal Database.

7. A computer system for providing verification for a simulation design, comprising:
   a processor;
   a memory;
   a storage device; and
   software instructions stored in the memory for enabling the computer system to:
      analyze a simulation design during a first stage of verification using a testbench comprising a rapid bug detection tool;
      if a bug is detected in the first stage, execute a second stage of verification, wherein a bug isolation tool is added to the testbench; and
      the bug is isolated and eliminated using the testbench comprising the bug isolation tool,
   wherein the bug isolation tool comprises a complex memory array monitor to examine stored entries, and
   wherein the rapid bug detection tool comprises an assertion suite that allows bug detection in a single cycle.

8. The computer system of claim 7, wherein the simulation design comprises a register transfer level design.

9. The computer system of claim 7, further comprising software instructions to:
   store a checkpoint state of a simulation; and
   restart the simulation from the checkpoint state, if the bug is detected.

10. The computer system of claim 7, wherein the rapid bug detection tool is lightweight.

11. The computer system of claim 7, wherein the rapid bug detection tool comprises at least one assertion suite selected from a group consisting of Open Verilog Language and System Verilog.

12. The computer system of claim 7, wherein the bug isolation tool comprises a tool to dump a signal trace in at least one file format selected from a group consisting of Value Change Dump, Waveform Intermediate Format, Integrated Signal Database, and Fast Signal Database.

13. A system for verifying a simulation design, comprising:
   a test vector providing an input signal value for the component in the simulation design;
   a testbench for verifying the simulation design using the test vector;
   a rapid bug detection tool associated with the testbench for analyzing the simulation design for a bug during a first stage of verification; and
   a bug isolation tool associated with the testbench for isolating and eliminating the bug during a second stage of verification, wherein the bug isolation tool is added to the testbench if the bug is detected by the rapid bug detection tool,
   wherein the bug isolation tool comprises a complex memory array monitor to examine stored entries, and
   wherein the rapid bug detection tool comprises an assertion suite that allows bug detection in a single cycle.

14. The system of claim 13, wherein the simulation design comprises a register transfer level design.

15. The system of claim 13, further comprising:
   a checkpoint state of a simulation that is stored and used to restart the simulation, if the bug is detected by the rapid bug detection tool.

16. The system of claim 13, wherein the rapid bug detection tool is lightweight.

17. The system of claim 13, wherein the rapid bug detection tool comprises at least one assertion suite selected from a group consisting of Open Verilog Language and System Verilog.

18. The system of claim 13, wherein the bug isolation tool comprises a tool to dump a signal trace in at least one file format selected from a group consisting of Value Change Dump, Waveform Intermediate Format, Integrated Signal Database, and Fast Signal Database.

19. An apparatus providing verification for a simulation design, comprising:
   means for analyzing a simulation design for a bug during a first stage of verification using a testbench comprising a rapid bug detection tool;
   means for adding a bug isolation tool to the testbench during a second stage of verification, if the bug is detected in the first stage;
   means for isolating and eliminating the bug using the testbench comprising the bug isolation tool,
   wherein the bug isolation tool comprises a complex memory array monitor to examine stored entries, and
   wherein the rapid bug detection tool comprises an assertion suite that allows bug detection in a single cycle.

* * * * *